(12) United States Patent
Yao et al.

(10) Patent No.: US 9,478,430 B2
(45) Date of Patent: *Oct. 25, 2016

(54) METHOD OF SEMICONDUCTOR INTEGRATED CIRCUIT FABRICATION

(71) Applicant: Taiwan Semiconductor Manufacturing Company, Ltd., Hsin-Chu (TW)

(72) Inventors: Hsin-Chieh Yao, Hsinchu (TW); Cheng-Hsiung Tsai, Miaoli County (TW); Chung-Ju Lee, Hsinchu (TW); Tien-I Bao, Taoyuan County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 66 days.

This patent is subject to a terminal disclaimer.

(21) Appl. No.: 14/532,462

(22) Filed: Nov. 4, 2014

(65) Prior Publication Data

US 2015/0056812 A1    Feb. 26, 2015

Related U.S. Application Data

(63) Continuation of application No. 13/682,837, filed on Nov. 21, 2012, now Pat. No. 8,890,321.

(51) Int. Cl.
*H01L 21/02* (2006.01)
*H01L 23/48* (2006.01)
*H01L 21/308* (2006.01)
*H01L 21/768* (2006.01)

(52) U.S. Cl.
CPC ....... *H01L 21/3086* (2013.01); *H01L 21/0226* (2013.01); *H01L 21/76816* (2013.01); *H01L 2924/0002* (2013.01)

(58) Field of Classification Search
CPC .......................... H01L 21/0226; H01L 23/48
USPC .................. 438/703, 127, 639, 107
See application file for complete search history.

(56) References Cited

U.S. PATENT DOCUMENTS 8,890,321 B2 * 11/2014 Yao ..................... H01L 21/0226
                                                              257/773
2009/0020150 A1   1/2009 Atwater et al.
2014/0138838 A1   5/2014 Yao et al.

* cited by examiner

*Primary Examiner* — Cuong Q Nguyen
(74) *Attorney, Agent, or Firm* — Haynes and Boone, LLP

(57) ABSTRACT

A method of fabricating a semiconductor integrated circuit (IC) is disclosed. The method includes providing a substrate. A first dielectric layer is deposited on the substrate. A patterned photoresist layer is formed on the first dielectric layer. The patterned photoresist layer is trimmed. The first dielectric layer is etched through the trimmed patterned photoresist layer to form a dielectric feature. A sacrificing energy decomposable layer (SEDL) is deposited on the dielectric feature and etched to form a SEDL spacer on sides of the dielectric feature. A second dielectric layer is deposited on the SEDL spacer and etched to form a dielectric spacer. The SEDL spacer is decomposed to form a trench.

20 Claims, 10 Drawing Sheets

METHOD OF SEMICONDUCTOR INTEGRATED CIRCUIT FABRICATION

This is a continuation of U.S. Ser. No. 13/682,837, filed Nov. 21, 2012, which is hereby incorporated in its entirety.

BACKGROUND

The semiconductor integrated circuit (IC) industry has experienced exponential growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Continuous advancements in lithographic resolution have been made to support critical dimensions (CDs) of 90 nm to 65 nm, 45 nm, 32 nm, 22 nm, 16 nm and beyond. New techniques in lithography have been developed, such as immersion lithography, multiple patterning, extreme ultraviolet (EUV) lithography and e-beam lithography. The challenges being raised by new lithography techniques are not only in resolution but also in economy (e.g. cost of upgrading and loss of throughput). Economy is often maintained by extending the use of existing lithography tools for advanced technology nodes. However, current methods have not been satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
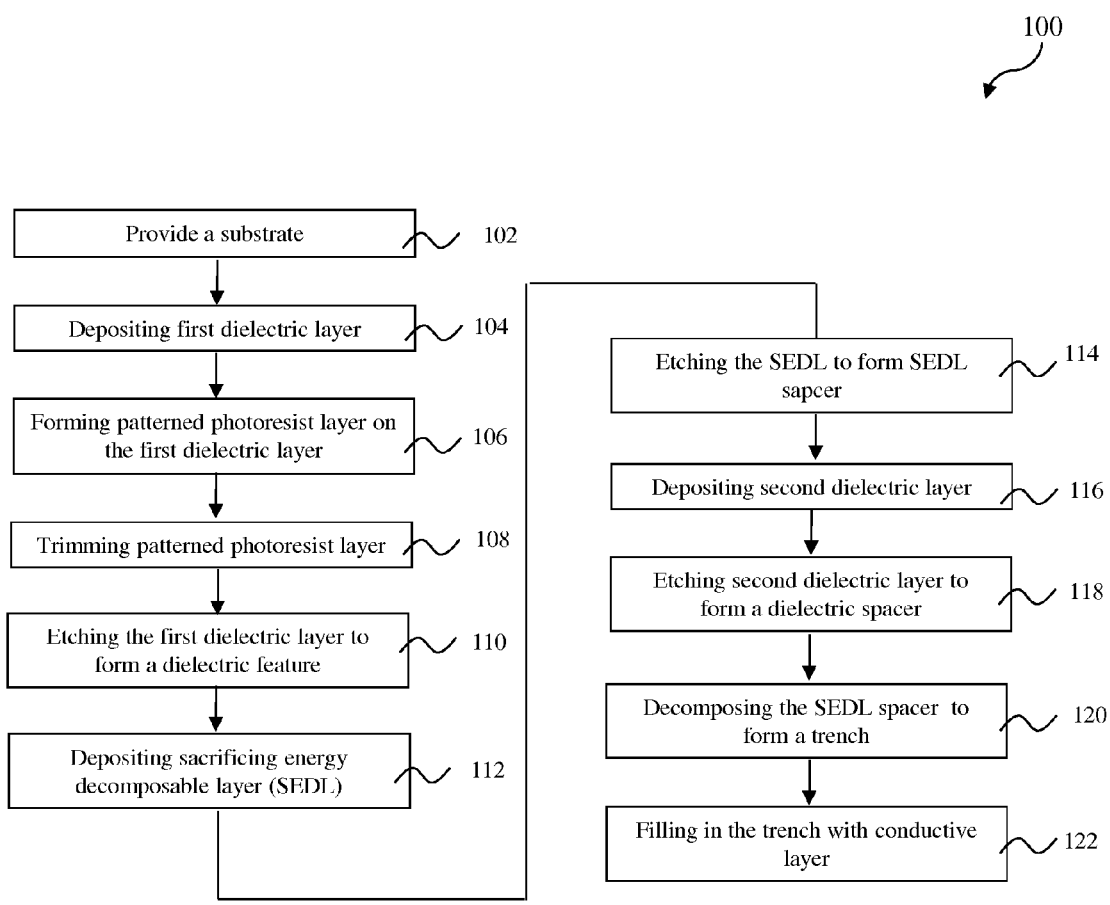
FIG. 1 is a flowchart of an example method for fabricating a semiconductor integrated circuit (IC) constructed according to various aspects of the present disclosure.

FIG. 1 is a flowchart of one embodiment of a method 100 of fabricating one or more semiconductor devices according to aspects of the present disclosure. The method 100 is discussed in detail below, with reference to a semiconductor device 200 shown in FIGS. 2 to 10 for the sake of example.

The method 100 begins at step 102 by providing a semiconductor substrate 210. The semiconductor substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit. In one example, the substrate 210 may include a portion of the interconnect structure and the interconnect structure includes a multi-layer interconnect (MLI) structure and an ILD layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

The substrate 210 may also conductive features, which may be part of the interconnect structure. For example, conductive features include contacts, metal vias, or metal lines. In one embodiment, the conductive features are further surrounded by a barrier layer to prevent diffusion and/or provide material adhesion. The conductive feature may include aluminum (Al), copper (Cu) or tungsten (W). The barrier layer may include titanium nitride (TiN), tantalum nitride (TaN), tungsten nitride (WN), titanium silicon nitride (TiSiN) or tantalum silicon nitride (TaSiN). The conductive features (and the barrier layer) may be formed by a procedure including lithography, etching and deposition. In another embodiment, the conductive features include electrodes, capacitors, resistors or a portion of a resistor. Alternatively, the conductive features may include doped regions (such as sources or drains), or gate electrodes. In another example, the conductive features are silicide features disposed on respective sources, drains or gate electrodes. The silicide feature may be formed by a self-aligned silicide (salicide) technique.

Figure 2:
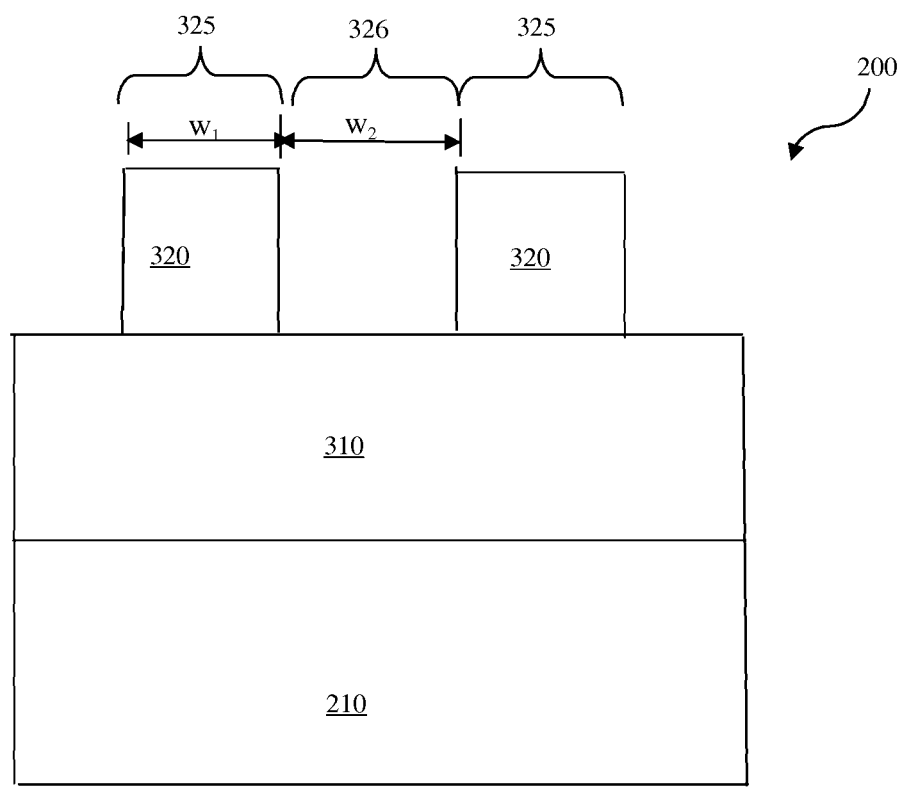
FIGS. 2 to 10 are cross-sectional views of an example semiconductor IC device at fabrication stages constructed according to the method of FIG. 1.

Referring to FIGS. 1 and 2, the method 100 proceeds to step 104 by depositing a first dielectric layer 310 on the substrate 210. The first dielectric layer 310 includes a dielectric material layer, such as silicon oxide, silicon nitride, a dielectric material layer having a dielectric constant (k) lower than thermal silicon oxide (therefore referred to as low-k dielectric material layer), or other suitable dielectric material layer. In one embodiment, the first dielectric layer 310 includes an extreme low k (XLK) dielectric material. The first dielectric layer 310 may be deposited by spin-on coating, chemical vapor deposition (CVD), or other suitable processes.

Referring again to FIGS. 1 and 2, the method 100 proceeds to step 106 by forming a patterned photoresist layer 320 over the first dielectric layer 310. Photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The patterned photoresist layer 320 defines a plurality of opaque regions 325 with a first width ($w_1$) and open regions 326 with a second width ($w_2$). In the present embodiment, both of widths $w_1$ and $w_2$ are substantially larger than a predetermined critical dimension (CD) of a feature to be made in the first dielectric layer 310. As an example, both of widths $w_1$ and $w_2$ are equal to three times of the predetermined CD. As another example, the width $w_1$ is equal to 2n+1 times of the predetermined CD, where n is an integer. As yet another embodiment, the width $w_2$ is equal or larger than the width $w_1$.

Figure 3:
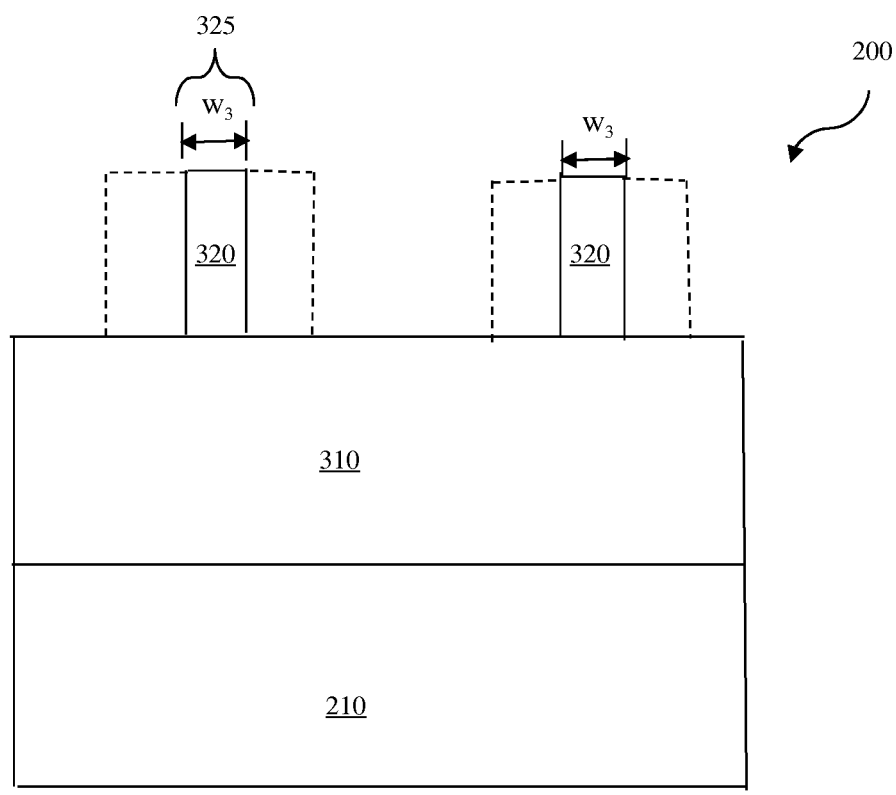

Referring to FIGS. 1 and 3, the method 100 proceeds to step 108 by trimming the patterned photoresist layer 320 to a third width ($w_3$). The width $w_3$ is substantially smaller than the width $w_1$. In one embodiment, the width $w_3$ is fairly same as the predetermined CD. The patterned photoresist layer 320 may be trimmed by plasma etching having carbon dioxide ($CO_2$)-containing gas, hydrogen-containing gas, nitrogen-containing gas, oxygen-containing gas, argon-containing gas, or other suitable gases and/or plasmas, and/or combinations thereof.

Figure 4:
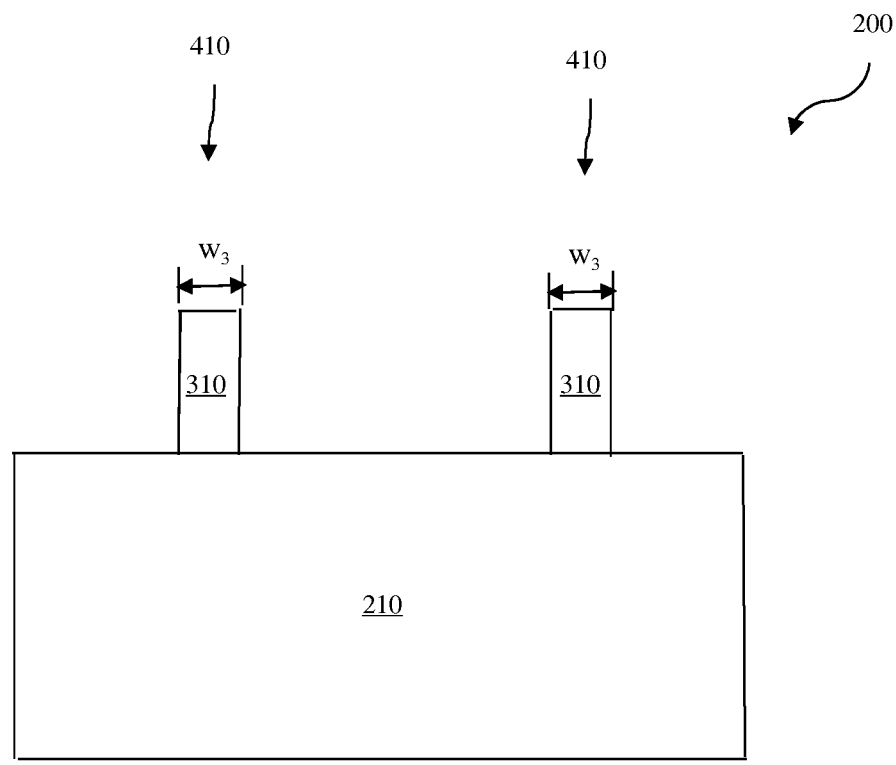

Referring to FIGS. 1 and 4, the method 100 proceeds to step 110 by etching the first dielectric layer 310 through the patterned photoresist layer 320 with the width $w_3$ to form a dielectric feature 410. The width $w_3$ of the patterned photoresist layer 310 is transferred to the dielectric feature 410 by controlling etching profile. The first dielectric layer 310 may be etched by dry etching, wet etching, or combinations thereof. In one embodiment, the XLK dielectric layer 310 is etched by fluorine-containing gas (e.g., CF4, SF6, CH2F2, CHF3, and/or C2F6) and after the etching, a substantially higher carbon concentration is observed in its outside layer of both sides of the dielectric feature 410, compared with its interior.

Figure 5:
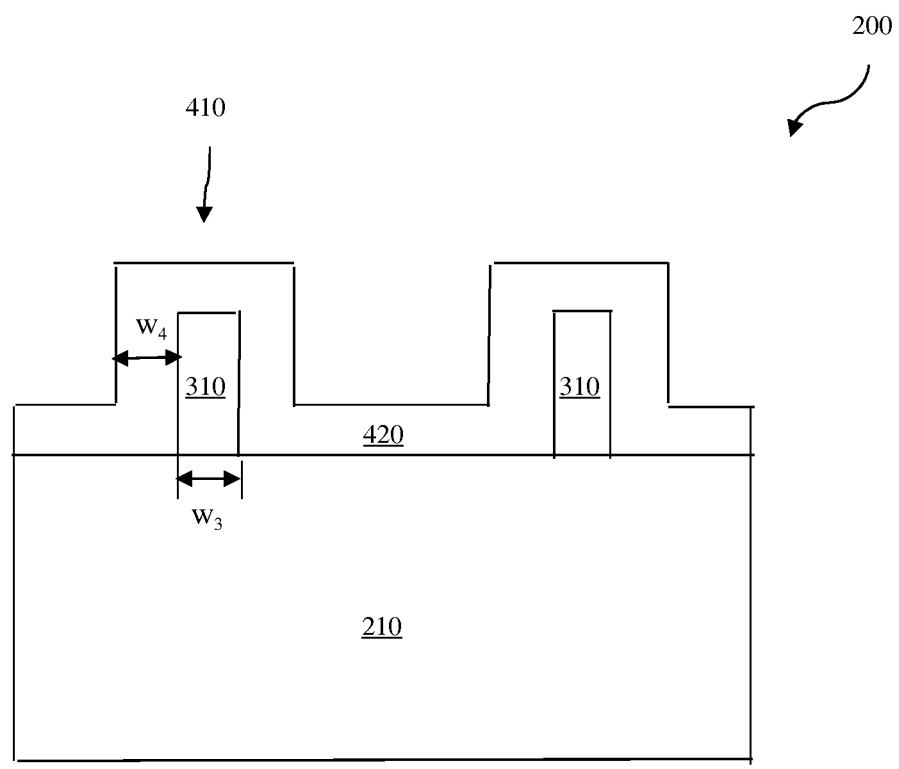

Referring to FIGS. 1 and 5, the method 100 proceeds to step 112 by depositing a sacrificing energy decomposable layer (SEDL) 420 on the dielectric feature 410. In the present embodiment, the SEDL 420 includes materials which are decomposed when they are exposed to a certain kind of energy, such as thermal energy, X-ray, ultraviolet (UV) light, infrared, electron beam, or any suitable type of energy. For example, the SEDL 420 includes P-copolymer (neopentyl methacrylate-co-ethylene glycol dimethacrylate). The SEDL 420 is deposited by CVD, ALD and other suitable deposition processes. In one embodiment, a thickness of the SEDL 420 is controlled in the deposition such that a fourth width ($w_4$) of the SEDL 420 along the dielectric feature 410 is fairly same as the width $w_3$.

Figure 6:
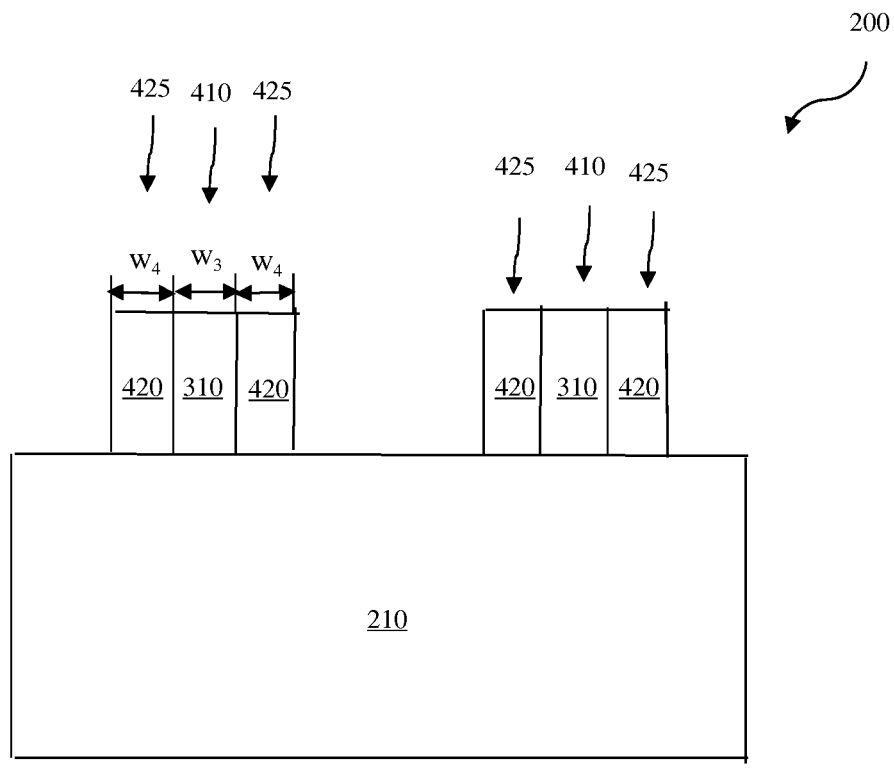

Referring to FIGS. 1 and 6, the method 100 proceeds to step 114 by etching the SEDL 420 to form a SEDL spacer 425 along the dielectric feature 410. The SEDL 420 may be etched by a dry etch, wet etch, or a combinations thereof. In one embodiment, the SEDL 420 is etched anisotropically by a plasma etching process and a width of the SEDL spacer 425 is controlled to have a fairly same width as width $w_4$.

Figure 7:
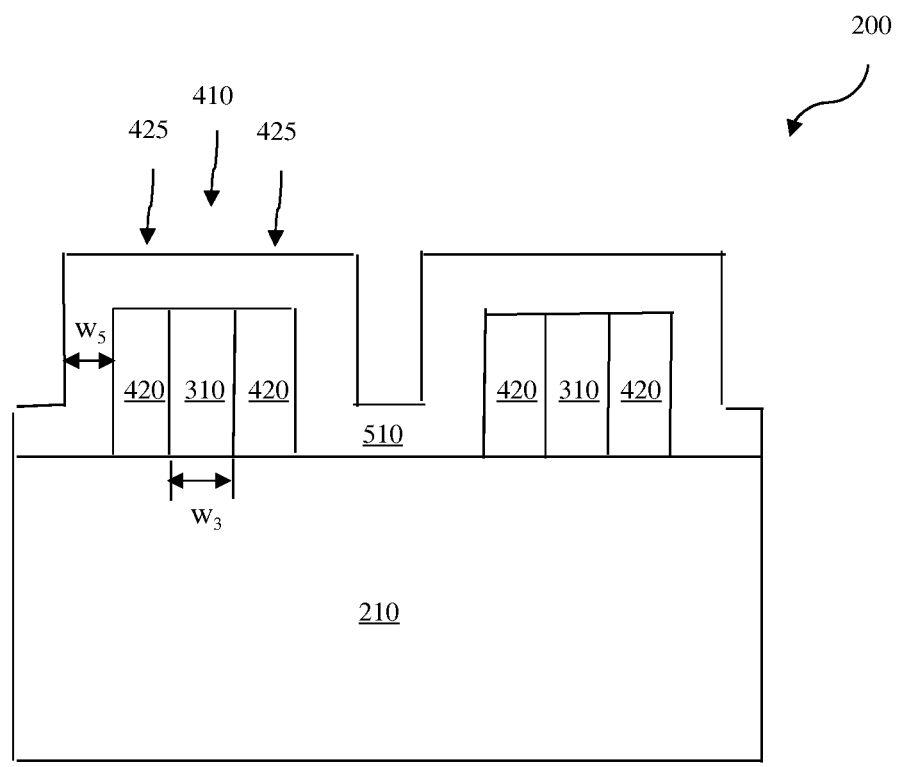

Referring to FIGS. 1 and 7, the method 100 proceeds to step 116 by depositing a second dielectric layer 510 over the SEDL spacer 425. The second dielectric layer 510 may include the same film as the first dielectric layer 310. For example, the second dielectric layer 510 includes an XLK dielectric material. Alternatively, the second dielectric layer 510 may include a different film from the first dielectric layer 310. The second dielectric layer 510 may be deposited similarly in many respects to depositing the first dielectric layer 310 discussed above in association with FIG. 2. In one embodiment, a thickness of the second dielectric layer 510 is controlled such that a fifth width ($w_5$) of a sidewall along the SEDL spacer 425 is fairly the same as the width $w_3$.

Figure 8:
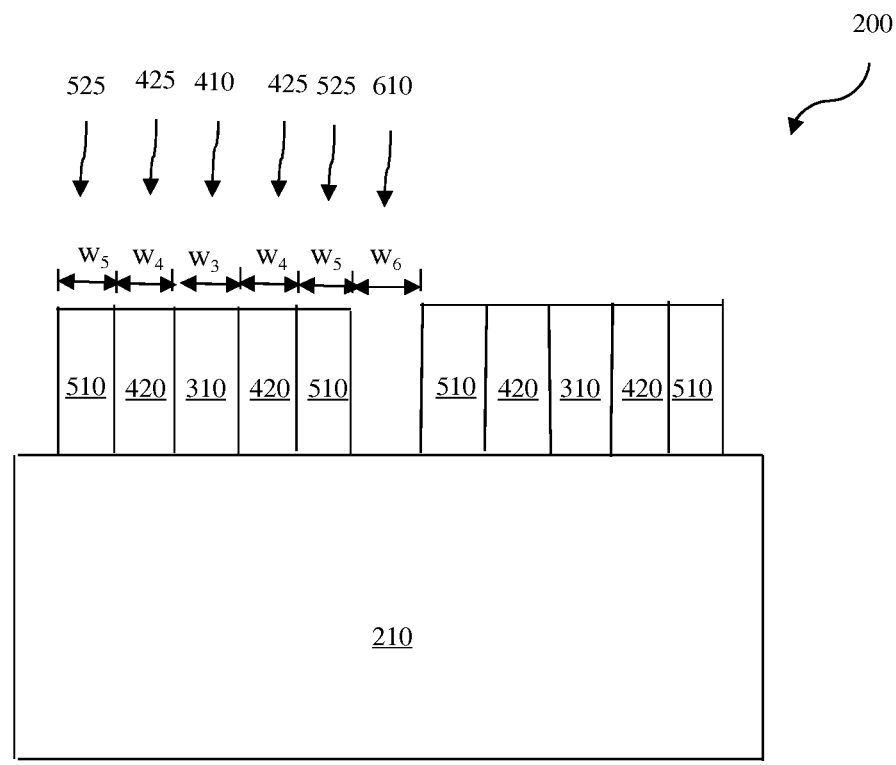

Referring to FIGS. 1 and 8, the method 100 proceeds to step 118 by etching the second dielectric layer 510 to form a dielectric spacer 525 on the side of the SEDL spacer 425, a first trench 610, and expose a top surface of the SEDL spacer 425. The spacer etching may be similar in many respects to the spacer etching of the first dielectric layer 310 discussed above in association with FIG. 6. In one embodiment, a width of the dielectric spacer 525 is controlled to be fairly same width as the width $w_5$. In another embodiment, the width $w_5$ is fairly same as the width $w_3$. The first trench 610 is configured with a sixth width ($w_6$). In one embodiment, the width $w_6$ is configured to be fairly same as the width $w_3$.

Figure 9:
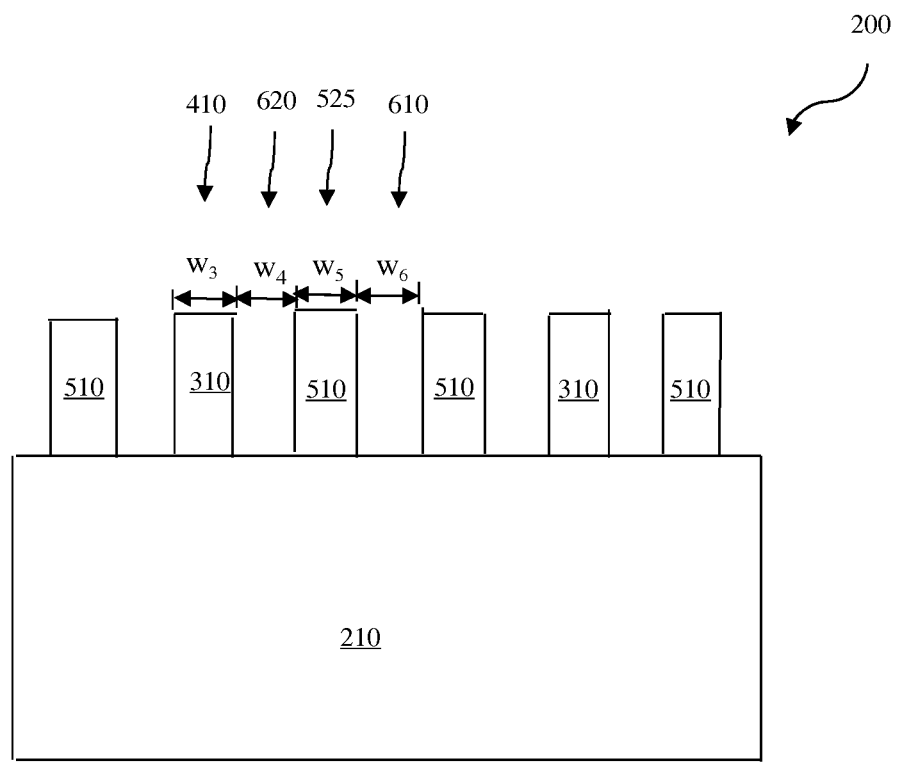

Referring to FIGS. 1 and 9, the method 100 proceeds to step 120 by decomposing the SEDL spacer 425 to form second trenches 620. In the present embodiment, the SEDL spacer 425 is decomposed by applying energy to the SEDL spacer 425. The applied energy may include thermal energy, X-ray, ultraviolet (UV) light, infrared, electron beam, or any suitable type of energy. As an example, an UV curing is performed to decompose the P copolymer SEDL spacer 425 with a temperature of about 425° C. The second trench 620 has a fairly same width of the width of the SEDL spacer 425, width $w_4$. In one embodiment, the width $w_4$ is configured to be equal to the width $w_3$.

The first trench 610 with the width $w_6$ is formed between two dielectric spacers 525 with the width $w_5$. The second trench 620 with the width $w_4$ is formed between one of the dielectric spacers 525 and one of the dielectric features 410 with the width $w_3$. In one embodiment, widths $w_3$, $w_4$, $w_5$ and $w_6$ are configured to be the same as the predetermined CD. For example, by setting both the width $w_1$ and the width $w_2$ as three times of the predetermined CD, controlling deposition thickness of the SEDL 420 and the second dielectric layer 510 such that their sidewall width is the same as the predetermined CD, controlling spacer etching of the SEDL 420 and the second dielectric layer 510 such that both of the SEDL spacer 425 and the dielectric spacer 525 have the same width as the predetermined CD, which is one third of the width $w_1$ patterned by a lithography tool. In another embodiment, both of the dielectric feature 410 and the dielectric spacer 525 are made of XLK dielectric material. The XLK feature 410 has a substantial higher carbon concentration on its outside layer of both sides comparing to its inside layer due to both side being exposed in a dry etching. The XLK spacer 525 has a substantial higher carbon concentration on its outside layer of one side comparing to it inside layer due to the side of XLK being exposed to a spacer etching.

Figure 10:
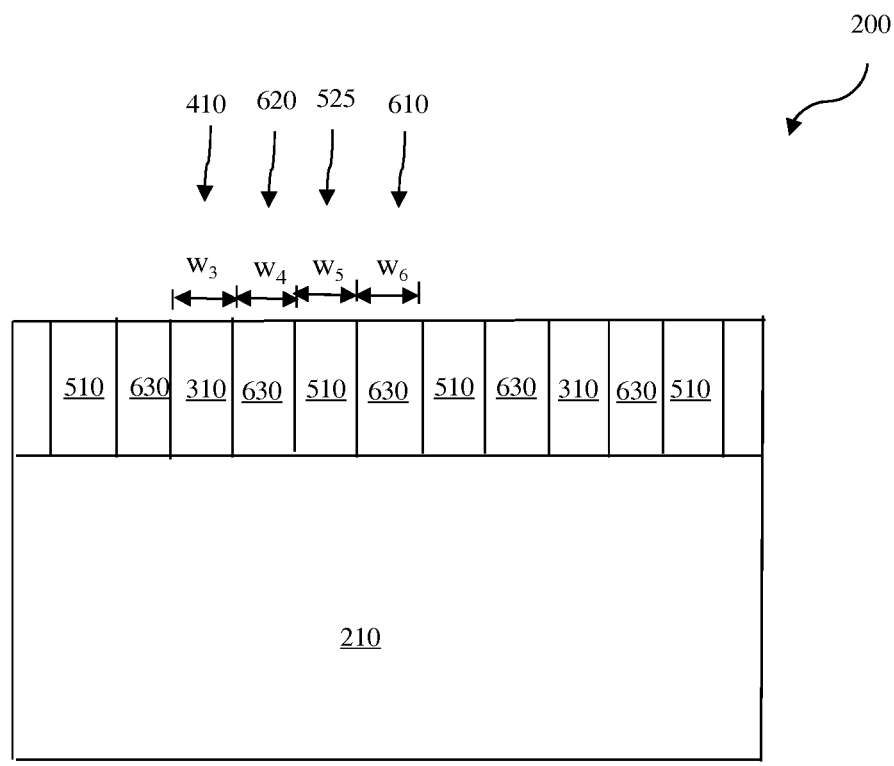

Referring to FIGS. 1 and 10, the method 100 proceeds to step 122 by depositing a conductive layer 630 on the substrate 210, including filing in trenches 610. The conductive layer 630 may include copper (Cu), aluminum (Al), tungsten (W), or copper alloy, such as copper magnesium (CuMn), copper aluminum (CuAl) or copper silicon (CuSi), or other suitable conductive material. The conductive layer 630 may includes multiple layers. The conductive layer 630 may be deposited by PVD, CVD, ALD, electrochemical plating (ECP), or other suitable processes. Additionally, a chemical mechanical polishing (CMP) process is performed subsequently to remove excessive conductive layer 630 to further planarize the top surface.

Additional steps can be provided before, during, and after the method 100, and some of the steps described can be replaced, eliminated, or moved around for additional embodiments of the method 100.

Based on the above, the present disclosure offers methods for fabricating IC device. The method employs a SEDL spacer approach to achieve a final CD which is substantially smaller than a starting CD printed by a lithography tool. The method provides a flexible and designable way to reduce the starting CD greatly by a non-lithography approach, which is mainly by configuring with spacer thickness and number of spacers. The method provides CD controlling by deposition and spacer etching processes to gain a better CD uniformity. The method demonstrates extending existing lithography tool's capability to a more advance resolution note.

The present disclosure provides many different embodiments of fabricating a semiconductor IC that provide one or more improvements over other existing approaches. In one embodiment, a method for fabricating a semiconductor integrated circuit (IC) includes providing a substrate, depositing a first dielectric layer on the substrate, forming a patterned photoresist layer on the first dielectric layer to have a plurality of opaque regions with a first width and opening regions with a second width, trimming the opaque region to a third width, etching the first dielectric layer through the patterned photoresist layer having the third width to form a dielectric feature, depositing a sacrificing energy decomposable layer (SEDL) on the dielectric feature, etching the SEDL to form a SEDL spacer on sides of the dielectric feature, depositing a second dielectric layer on the SEDL spacer, etching the second dielectric layer to form a dielectric spacer on sides of the SEDL spacer and decomposing the SEDL to remove the SEDL spacer to form a trench.

In another embodiment, a method for fabricating a semiconductor IC includes providing a substrate providing a substrate, depositing a first dielectric layer on the substrate, forming a patterned photoresist layer on the first dielectric layer to have a plurality of opaque regions with a first width and opening regions with a second width. The first width is equal to 2n+1 times of a predetermined critical dimension (CD) of the first dielectric layer, where n is an integer. The second width is equal or larger than the first width. The method also includes performing a dry etching to trim the opaque region to a third width, wherein the third width is substantial smaller width than the first width, etching the first dielectric layer through patterned photoresist layer having the third width of the opaque region to form a dielectric feature. The dielectric feature has a width fairly same as the third width. The method also includes depositing a sacrificing energy decomposable layer (SEDL) on the dielectric feature, etching the SEDL to form a SEDL spacer on sides of the dielectric feature with a spacer width which is fairly same as the third width, depositing a second dielectric layer on the SEDL spacer, etching the second dielectric layer to form a dielectric spacer on sides of the SDL spacer with a spacer width which is fairly same as the third width, decomposing the SEDL to remove the SEDL spacer to form a trench with a width which is fairly same as the third width and filling in the trench with a conductive layer.

In yet another embodiment, a semiconductor IC fabricated by the method of the present disclosure includes a substrate a substrate, a first extreme low k (XLK) dielectric feature on the substrate and it has a substantial higher carbon concentration in its outside layer on both side of it, comparing with its inside layer. The semiconductor IC also includes a second XLK dielectric feature between but not adjacent the two first XLK dielectric features and it has a substantial higher carbon concentration in its outside layer on one side of it, comparing with its inside layer. The semiconductor IC also includes a conductive layer filled trenches of between the first XLK dielectric feature and one of the second XLK dielectric features and between the second XLK dielectric feature and the other of the first XLK dielectric features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising:
    depositing a first dielectric layer on a substrate;
    forming a patterned photoresist layer on the first dielectric layer to have opaque regions and openings;
    trimming the opaque regions;
    etching the first dielectric layer through the patterned photoresist layer to form a dielectric feature;
    forming sacrificing-energy-decomposable-layer (SEDL) spacers along sidewalls of the dielectric feature;
    forming dielectric spacers along sidewalls of the SEDL spacers; and
    decomposing the SEDL spacers to form trenches over the substrate.

2. The method of claim 1, wherein the opaque regions have a first width and the openings have a second width, wherein the first width is about 2n+1 times a predetermined critical dimension (CD), where n is an integer, and wherein the second width is equal to or larger than the first width.

3. The method of claim 1, wherein the opaque regions are trimmed to a width, which is substantially similar to the predetermined CD.

4. The method of claim 2, wherein the predetermined CD is a width of the dielectric feature.

5. The method of claim 1, wherein the SEDL spacers are formed by depositing a SEDL over the dielectric feature and then anisotropically etching the SEDL.

6. The method of claim 5, wherein the SEDL includes P-copolymer (neopentyl methacrylate-co-ethylene glycol dimethacrylate).

7. The method of claim 2, wherein a width of the SEDL spacers is substantially similar to the predetermined CD.

8. The method of claim 1, wherein the dielectric spacers are formed by depositing a second dielectric layer over the SEDL spacers and then anisotropically etching the second dielectric layer.

9. The method of claim 2, wherein a width of the dielectric spacers is controlled to be fairly same as the predetermined CD.

10. The method of claim 1, wherein the SEDL spacers include a material which is decomposed when it is exposed to one or more energy sources from the group consisting of thermal energy, X-ray, ultraviolet (UV) light, infrared and electron beam.

11. The method of claim 10, wherein the SEDL spacers include P-copolymer (neopentyl methacrylate-co-ethylene glycol dimethacrylate).

12. The method of claim 11, wherein the SEDL spacers of the P-copolymer are decomposed by a curing process with a temperature about 425° C.

13. The method of claim 1, further comprising:
    filling in the trench with a conductive layer to form an electric interconnection.

14. A method for fabricating a semiconductor integrated circuit (IC), the method comprising:
    depositing a first dielectric layer on a substrate;
    forming a patterned photoresist layer on the first dielectric layer to have a plurality of opaque regions with a first width and open regions with a second width, wherein the second width is equal to or larger than the first width;
    trimming the opaque regions to a third width, wherein the third width is substantially smaller than the first width;
    etching the first dielectric layer to form a dielectric feature by using the trimmed opaque regions as an etching mask, wherein the dielectric feature has a width fairly same as the third width;
    depositing a sacrificing energy decomposable layer (SEDL) on the dielectric feature;
    etching the SEDL to form a SEDL spacer on sides of the dielectric feature with a spacer width which is substantially similar to the third width;
    depositing a second dielectric layer on the SEDL spacer;
    etching the second dielectric layer to form a dielectric spacer on sides of the SEDL spacer with a spacer width which is fairly same as the third width;
    decomposing the SEDL to remove the SEDL spacer to form a trench with a width which is fairly same as the third width; and
    filling in the trench with a conductive layer.

15. The method of claim 14, wherein the SEDL includes a material which is decomposed when exposed to one or more energy sources from the group consisting of thermal energy, X-ray, ultraviolet (UV) light, infrared and electron beam.

16. The method of claim 15, wherein the SEDL includes P-copolymer (neopentyl methacrylate-co-ethylene glycol dimethacrylate) and is decomposed by a curing process with a temperature about 425° C.

17. A method for fabricating a semiconductor integrated circuit (IC), the method comprising:
    forming a first feature of a first dielectric material over a substrate;
    forming sacrificing-energy-decomposable-layer (SEDL) spacers along sidewalls of the first feature;
    forming dielectric spacers of a second dielectric material along sidewalls of the SEDL spacers; and
    decomposing the SEDL spacers to form trenches between the first feature and the dielectric spacers.

18. The method of claim 17, wherein the forming of the first feature includes:
    depositing a first layer of the first dielectric material on the substrate;
    forming a patterned photoresist layer on the first layer to have a plurality of opaque regions and openings;
    trimming the opaque regions; and
    etching the first layer through the patterned photoresist layer to form the dielectric feature.

19. The method of claim 17, wherein the first and second dielectric materials are the same and are both an extreme low-k (XLK) dielectric material.

20. The method of claim 17, wherein the decomposing of the SEDL spacers includes exposing the SEDL spacers to one or more energy sources selected from the group consisting of thermal energy, X-ray, ultraviolet (UV) light, infrared, and electron beam.

* * * * *